(12) United States Patent  
Ono et al.

(10) Patent No.: US 12,456,628 B2  
(45) Date of Patent: Oct. 28, 2025

(54) SUBSTRATE PROCESSING METHOD AND SUBSTRATE PROCESSING APPARATUS

(71) Applicant: Tokyo Electron Limited, Tokyo (JP)

(72) Inventors: Kenta Ono, Miyagi (JP); Shinya Ishikawa, Miyagi (JP); Tetsuya Nishizuka, Miyagi (JP); Masanobu Honda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 258 days.

(21) Appl. No.: 18/454,624

(22) Filed: Aug. 23, 2023

(65) Prior Publication Data

US 2024/0047220 A1 Feb. 8, 2024

Related U.S. Application Data

(63) Continuation of application No. PCT/JP2022/007605, filed on Feb. 24, 2022.

(30) Foreign Application Priority Data

Feb. 24, 2021 (JP) .................................. 2021-027199

(51) Int. Cl.  
*H01L 21/311* (2006.01)  
*H01J 37/32* (2006.01)  
*H01L 21/027* (2006.01)  
*H01L 21/3065* (2006.01)

(52) U.S. Cl.  
CPC .... *H01L 21/31116* (2013.01); *H01J 37/3244* (2013.01); *H01L 21/0274* (2013.01); *H01L 21/3065* (2013.01); *H01J 2237/334* (2013.01)

(58) Field of Classification Search  
None  
See application file for complete search history.

(56) References Cited

U.S. PATENT DOCUMENTS

| | | | |
|---|---|---|---|
| 9,899,219 B2 | 2/2018 | Luong et al. | |
| 2018/0337046 A1* | 11/2018 | Shamma | H01L 21/67703 |
| 2019/0148551 A1* | 5/2019 | More | H01L 21/02579 |
| | | | 257/192 |
| 2019/0237341 A1 | 8/2019 | Yu et al. | |
| 2019/0318936 A1 | 10/2019 | Katsunuma | |
| 2020/0273705 A1 | 8/2020 | Singh et al. | |
| 2021/0265163 A1* | 8/2021 | Yu | H01L 21/32139 |

(Continued)

FOREIGN PATENT DOCUMENTS

JP 2016-173415 A 9/2016

*Primary Examiner* — Allan W. Olsen  
(74) *Attorney, Agent, or Firm* — PROCOPIO, CORY, HARGREAVES & SAVITCH LLP

(57) ABSTRACT

One exemplary embodiment provides a substrate processing method. The method includes: providing a substrate, the substrate including a carbon-containing film, an intermediate film on the carbon-containing film, and a tin-containing film on the intermediate film, the tin-containing film having an opening pattern; first etching, the first etching including etching the intermediate film using the tin-containing film as a mask to transfer the opening pattern to the intermediate film; and second etching, the second etching using a plasma formed from a processing gas to remove the tin-containing film and etch the carbon-containing film using the intermediate film as a mask, the processing gas including hydrogen, halogen or carbon, and oxygen.

19 Claims, 8 Drawing Sheets

(56) References Cited

U.S. PATENT DOCUMENTS

| | | | |
|---|---|---|---|
| 2021/0307172 A1* | 9/2021 | Darmawikarta | ........ H05K 1/116 |
| 2021/0398818 A1* | 12/2021 | Ono | .................. H01L 21/32137 |
| 2022/0208551 A1* | 6/2022 | Heo | .................. H01L 21/02274 |
| 2023/0377899 A1* | 11/2023 | Yonezawa | ........... H01J 37/3244 |

* cited by examiner

SUBSTRATE PROCESSING METHOD AND SUBSTRATE PROCESSING APPARATUS

CROSS-REFERENCE TO RELATED APPLICATION

The present application claims priority under 35 U.S.C. § 119 to Japanese Patent Application No. 2021-027199 filed on Feb. 24, 2021, and PCT Application No. PCT/JP2022/007605 filed on Feb. 22, 2022, the entire contents of which are incorporated herein by reference.

BACKGROUND

Field

Exemplary embodiments of the present disclosure relate to a substrate processing method and a substrate processing apparatus.

Description of Related Art

U.S. Pat. No. 9,899,219 B2 discloses a technique of trimming inorganic resist using a processing gas containing $CH_3F$ or $BCl_3$ to uniformize the dimensions of a pattern formed in the resist.

SUMMARY

One embodiment of the present disclosure provides a substrate processing method including: providing a substrate, the substrate including a carbon-containing film, an intermediate film on the carbon-containing film, and a tin-containing film on the intermediate film, the tin-containing film having an opening pattern; performing first etching, the first etching including etching the intermediate film using the tin-containing film as a mask to transfer the opening pattern to the intermediate film; and performing second etching, the second etching using a plasma formed from a processing gas to remove the tin-containing film and etch the carbon-containing film using the intermediate film as a mask, the processing gas including hydrogen, halogen or carbon, and oxygen.

BRIEF DESCRIPTION OF DRAWINGS

FIG. 8A illustrates an example of the cross-sectional structure of the substrate W before the process in step ST1a.

FIG. 8B illustrates an example of the cross-sectional structure of the substrate W after the process in step ST1a.

DETAILED DESCRIPTION

Figure 1:
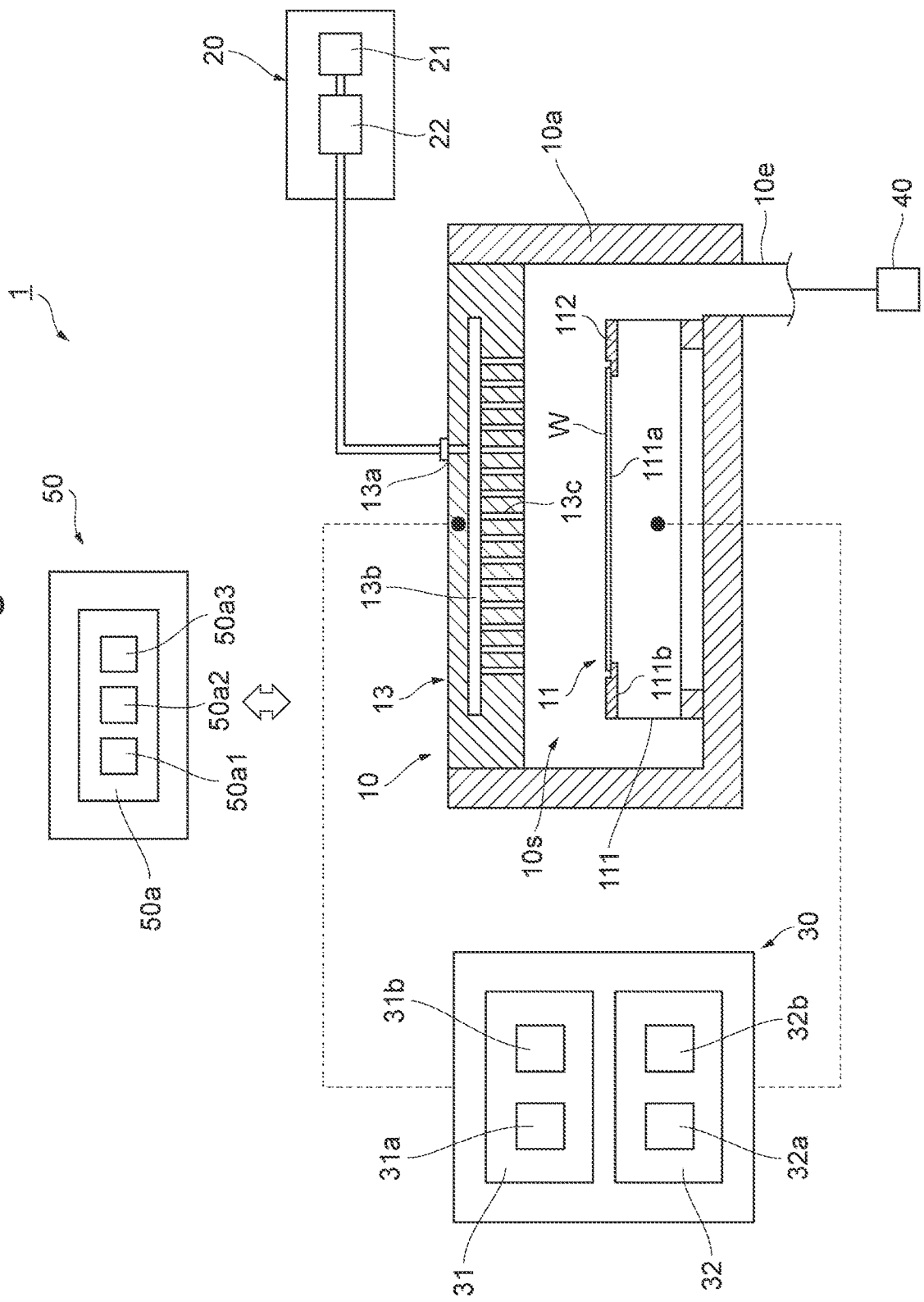
FIG. 1 schematically illustrates a substrate processing apparatus 1.

The following describes embodiments of the present disclosure.

One exemplary embodiment provides a substrate processing method including: providing a substrate, the substrate including a carbon-containing film, an intermediate film on the carbon-containing film, and a tin-containing film on the intermediate film, the tin-containing film having an opening pattern; performing first etching, the first etching including etching the intermediate film using the tin-containing film as a mask to transfer the opening pattern to the intermediate film; and performing second etching, the second etching using a plasma formed from a processing gas to remove the tin-containing film and etch the carbon-containing film using the intermediate film as a mask, the processing gas including hydrogen, halogen or carbon, and oxygen.

In one exemplary embodiment, the method further includes, before the first etching, trimming at least a sidewall of the tin-containing film using a plasma formed from a gas containing at least one selected from the group consisting of hydrogen, halogen, and carbon.

In one exemplary embodiment, the gas containing at least one selected from the group consisting of hydrogen, halogen and carbon is at least one gas selected from the group consisting of $H_2$ gas, HBr gas, HCl gas, HI gas, $CH_4$ gas, $CHF_3$ gas, $Cl_2$ gas, CO gas and $Br_2$ gas.

In one exemplary embodiment, the method further includes, before the first etching, trimming at least a sidewall of the tin-containing film using hydrogen halide.

In one exemplary embodiment, the hydrogen halide is at least one gas selected from the group consisting of HBr gas, HCl gas and HI gas.

In one exemplary embodiment, the tin-containing film is a photoresist film formed on the intermediate film.

In one exemplary embodiment, in the providing the substrate, the provided substrate includes a residue at a part of a sidewall of the tin-containing film, the residue extending to another part of the sidewall.

In one exemplary embodiment, the processing gas includes a gas composed of molecules containing any one of Br, Cl, and I.

In one exemplary embodiment, the processing gas includes $CH_3OH$ gas or a mixture of $CH_4$ gas and $O_2$ gas.

In one exemplary embodiment, the processing gas includes inert gas.

In one exemplary embodiment, the intermediate film is a spin-on-glass (SOG) film, a SiON film, a SiC film, or a Si-containing antireflection film (SiARC).

In one exemplary embodiment, the carbon-containing film is a spin-on carbon (SOC) film or an amorphous carbon film (ACL).

In one exemplary embodiment, the carbon-containing film is formed on an underlying film, and the method further includes, after the second etching, performing third etching that etches the underlying film using the carbon-containing film as a mask.

In one exemplary embodiment, a substrate processing method includes: providing a substrate, the substrate including a carbon-containing film, an intermediate film on the carbon-containing film, and a tin-containing film on the intermediate film, the tin-containing film having an opening pattern; performing first etching, the first etching including etching the intermediate film using the tin-containing film as a mask to transfer the opening pattern to the intermediate film; removing the tin-containing film; and performing second etching, the second etching using a plasma formed from a processing gas to etch the carbon-containing film using the intermediate film as a mask, the processing gas including hydrogen, halogen or carbon, and oxygen.

In one exemplary embodiment, removing the tin-containing film includes etching the tin-containing film using a plasma formed from a gas containing at least one selected from the group consisting of hydrogen, halogen, and carbon.

In one exemplary embodiment, the gas containing at least one selected from the group consisting of hydrogen, halogen and carbon is at least one gas selected from the group consisting of $H_2$ gas, HBr gas, HCl gas, HI gas, $CH_4$ gas, $CHF_3$ gas, $Cl_2$ gas, CO gas and $Br_2$ gas.

In one exemplary embodiment, removing the tin-containing film includes removing the tin-containing film using hydrogen halide.

In one exemplary embodiment, the hydrogen halide is at least one gas selected from the group consisting of HBr gas, HCl gas and HI gas.

In one exemplary embodiment, a substrate processing apparatus includes a plasma processing chamber having at least one gas inlet and at least one gas outlet, a substrate support in the chamber; a plasma generator; and a controller configured to cause placing a substrate on the substrate support, the substrate including a carbon-containing film, an intermediate film on the carbon-containing film, and a tin-containing film on the intermediate film, the tin-containing film having an opening pattern; etching the intermediate film using the tin-containing film as a mask to transfer the opening pattern to the intermediate film; performing first etching, the first etching including etching the intermediate film using the tin-containing film as a mask to transfer the opening pattern to the intermediate film; and performing second etching, the second etching using a plasma formed from a processing gas to remove the tin-containing film and etch the carbon-containing film using the intermediate film as a mask, the processing gas including hydrogen, halogen or carbon, and oxygen.

The following describes embodiments of the present disclosure in details with reference to the drawings. Like reference numerals designate like elements in the drawings to omit their duplicated descriptions. Unless otherwise specified, positional relationships such as top, bottom, left, and right will be described based on the positional relationships illustrated in the drawings. The accompanying drawings have not necessarily been drawn to scale, and the actual proportions are not limited to the illustrated ones.

<Configuration of Substrate Processing Apparatus 1>

FIG. 1 schematically illustrates a substrate processing apparatus 1 according to one exemplary embodiment. A substrate processing method according to one exemplary embodiment (hereinafter referred to as "the present processing method") may be performed using the substrate processing apparatus 1.

The substrate processing apparatus 1 is a capacitively coupled plasma processing apparatus. The substrate processing apparatus 1 includes a plasma processing chamber 10, a gas supply 20, a power supply 30, an exhaust system 40, and a controller 50. The substrate processing apparatus 1 also includes a substrate support 11, and a gas inlet. The gas inlet is configured to introduce at least one processing gas into the plasma processing chamber 10. The gas inlet includes a showerhead 13. The substrate support 11 is disposed in the plasma processing chamber 10. The showerhead 13 is disposed above the substrate support 11. In one exemplary embodiment, the showerhead 13 constitutes at least part of the ceiling of the plasma processing chamber 10. The plasma processing chamber 10 has a plasma processing space 10s defined by the showerhead 13, sidewalls 10a of the plasma processing chamber 10 and the substrate support 11. The plasma processing chamber 10 has at least one gas supply port for supplying at least one processing gas to the plasma processing space 10s and at least one gas exhaust port for exhausting gas from the plasma processing space. The sidewalls 10a are grounded. The showerhead 13 and the substrate support 11 are electrically insulated from the housing of the plasma processing chamber 10.

The substrate support 11 includes a body 111 and a ring assembly 112. The body 111 has a central region (substrate support face) 111a for supporting a substrate (wafer) W and an annular region (ring support face) 111b for supporting the ring assembly 112. The annular region 111b of the body 111 surrounds the central region 111a of the body 111 in plan view. The substrate W is disposed on the central region 111a of the body 111, and the ring assembly 112 is disposed on the annular region 111b of the body 111 so as to surround the substrate W on the central region 111a of the body 111. In one exemplary embodiment, the body 111 includes a base and an electrostatic chuck. The base includes an electrically conductive member. The electrically conductive member of the base functions as a lower electrode. The electrostatic chuck is disposed on the base. The top face of the electrostatic chuck has the substrate support face 111a. The ring assembly 112 includes one or more annular members. At least one of the one or more annular members is an edge ring. Although not illustrated, the substrate support 11 may include a temperature-controlled module configured to control at least one of the electrostatic chuck, the ring assembly 112, and the substrate to a target temperature. The temperature-controlled module may include a heater, a heat transfer medium, a channel, or a combination of them. A heat transfer fluid, such as brine or gas, flows through the channel. The substrate support 11 may include a heat-transfer gas supply configured to supply a heat transfer gas to between the rear face of the substrate W and the substrate support face 111a.

The showerhead 13 is configured to introduce at least one processing gas from the gas supply 20 into the plasma processing space 10s. The showerhead 13 has at least one gas supply port 13a, at least one gas diffuser 13b, and a plurality of gas inlets 13c. The processing gas supplied to the gas supply port 13a passes through the gas diffuser 13b and is introduced into the plasma processing space 10s from the plurality of gas inlets 13c. The showerhead 13 includes an electrically conductive member. The electrically conductive member of the showerhead 13 functions as an upper electrode. In addition to the showerhead 13, the gas inlet may include one or more side gas injectors (SGIs) attached to one or more openings formed in the sidewalls 10a.

The gas supply 20 may include at least one gas source 21 and at least one flow rate controller 22. In one exemplary embodiment, the gas supply 20 is configured to supply at least one processing gas from a corresponding gas source 21 to the showerhead 13 via a corresponding flow rate controller 22. For instance, each flow rate controller 22 may include a mass flow controller or a pressure-controlled flow rate controller. The gas supply 20 also may include one or more flow rate modulation devices that modulate or pulse the flow rate of the at least one processing gas.

The power supply 30 includes a RF power supply 31 that is coupled to the plasma processing chamber 10 via at least one impedance matching circuit. The RF power supply 31 is configured to supply at least one RF signal (RF power), such as a source RF signal and a bias RF signal, to the electrically conductive member of the substrate support 11 and/or the electrically conductive member of the showerhead 13. This forms a plasma from the at least one processing gas supplied to the plasma processing space 10s. Thus, the RF power supply 31 can function as at least part of a plasma generator that is configured to form a plasma from one or more processing gases in the plasma processing chamber 10. A bias RF signal, which is supplied to the electrically conductive member of the substrate support 11, generates a bias potential in the substrate W, so that ion components in the formed plasma can be drawn toward the substrate W.

In one exemplary embodiment, the RF power supply 31 includes a first RF generator 31a and a second RF generator 31b. The first RF generator 31a is coupled to the electrically conductive member of the substrate support 11 and/or the electrically conductive member of the showerhead 13 via at least one impedance matching circuit and is configured to generate a source RF signal (source RF power) for plasma generation. In one exemplary embodiment, the source RF signal has a frequency in the range of 13 MHz to 150 MHz. In one exemplary embodiment, the first RF generator 31a may be configured to generate a plurality of source RF signals each having a different frequency. The generated one or more source RF signals are supplied to the electrically conductive member of the substrate support 11 and/or the electrically conductive member of the showerhead 13. The second RF generator 31b is coupled to the electrically conductive member of the substrate support 11 via at least one impedance matching circuit and is configured to generate a bias RF signal (bias RF power). In one exemplary embodiment, the bias RF signal has a frequency lower than the frequency of the source RF signal. In one exemplary embodiment, the bias RF signal has a frequency in the range of 400 kHz to 40 MHz. In one exemplary embodiment, the second RF generator 31b may be configured to generate a plurality of bias RF signals each having a different frequency. The generated one or more bias RF signals are supplied to the electrically conductive member of the substrate support 11. In various embodiments, at least one of the source RF signal and bias RF signal may be pulsed.

The power supply 30 may also include a DC power supply 32 that is coupled to the plasma processing chamber 10. The DC power supply 32 includes a first DC generator 32a and a second DC generator 32b. In one exemplary embodiment, the first DC generator 32a is connected to the electrically conductive member of the substrate support 11 and is configured to generate a first DC signal. The generated first bias DC signal is applied to the electrically conductive member of the substrate support 11. In one exemplary embodiment, the first DC signal may be applied to other electrodes, such as an electrode in the electrostatic chuck. In one exemplary embodiment, the second DC generator 32b is connected to the electrically conductive member of the showerhead 13 and is configured to generate a second DC signal. The generated second DC signal is applied to the electrically conductive member of the showerhead 13. In various embodiments, at least one of the first and second DC signals may be pulsed. The first and second DC generators 32a and 32b may be provided in addition to the RF power supply 31, or the first DC generator 32a may be provided instead of the second RF generator 31b.

For instance, the exhaust system 40 can be connected to a gas exhaust port 10e provided at the bottom of the plasma processing chamber 10. The exhaust system 40 may include a pressure regulation valve and a vacuum pump. The pressure regulation valve regulates the pressure in the plasma processing space 10s. The vacuum pump may include a turbomolecular pump, a dry pump, or a combination of these.

The controller 50 processes computer-executable instructions that cause the substrate processing apparatus 1 to perform various steps described in this disclosure. The controller 50 can be configured to control each element of the substrate processing apparatus 1 to perform various steps described herein. In one embodiment, part or all of the controller 50 may be provided as part of a configuration of an apparatus external to the substrate processing apparatus 1. For instance, the controller 50 may include a computer 50a. The computer 50a may include a processor (central processing unit: CPU) 50a1, a storage 50a2, and a communication interface 50a3. The processor 50a1 can be configured to execute various control operations based on a program stored in the storage 50a2. The storage 50a2 may include random access memory (RAM), read only memory (ROM), a hard disk drive (HDD), solid state drive (SSD), or a combination of them. The communication interface 50a3 may communicate with other components of the substrate processing apparatus 1 via a communication line such as a local area network (LAN).

<Configuration of Substrate Processing System PS>

Figure 2:
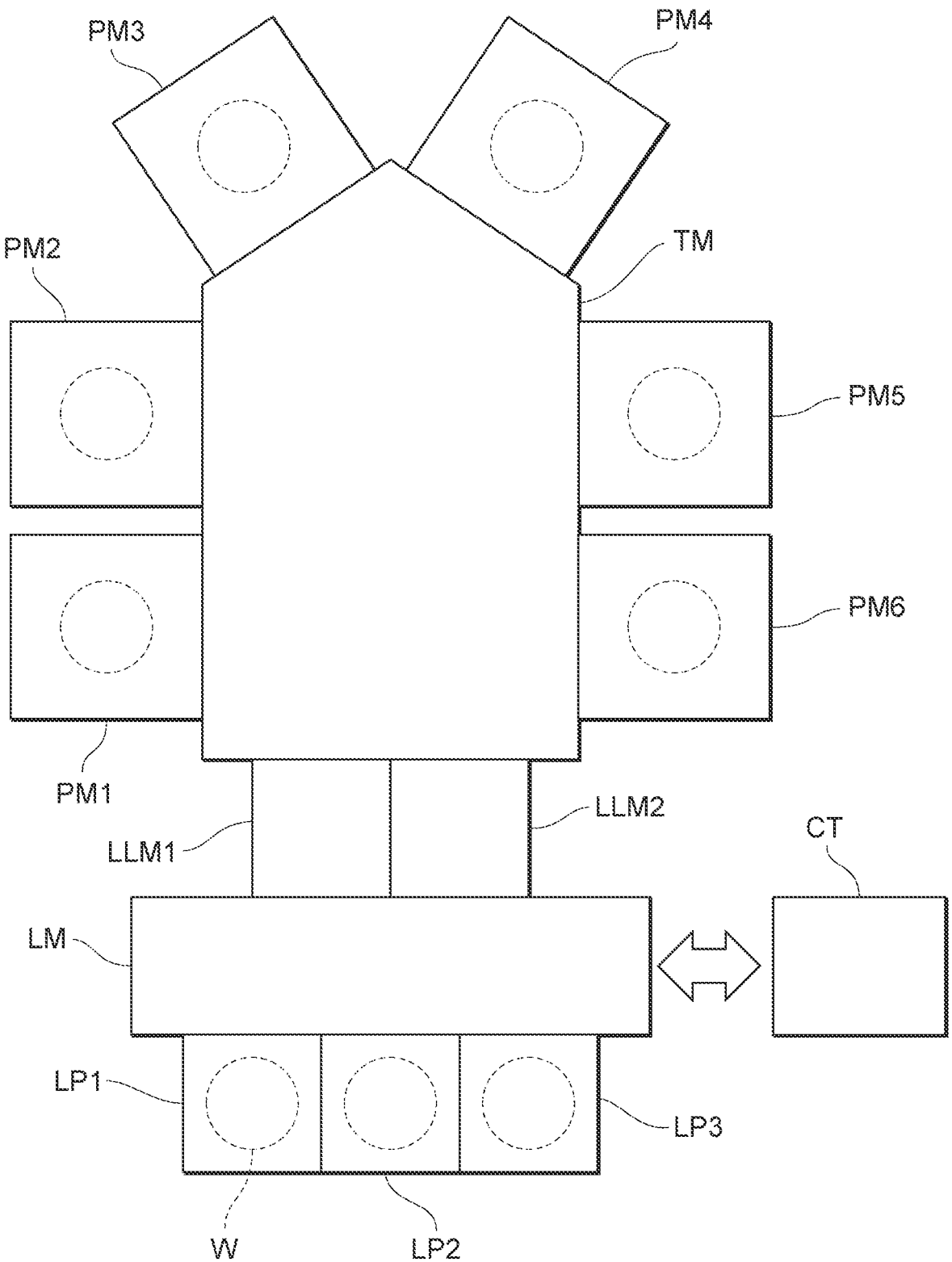
FIG. 2 schematically illustrates a substrate processing system PS.

FIG. 2 schematically illustrates the substrate processing system PS according to one exemplary embodiment. The present processing method may be performed using the substrate processing system PS.

The substrate processing system PS includes substrate processing chambers PM1 to PM6 (hereinafter also collectively referred to as "substrate processing module PM"), a transfer module TM, load-lock modules LLM1 and LLM2 (hereinafter also collectively referred to as "load-lock module LLM"), a loader module LM, and load ports LP1 through LP3 (hereinafter also collectively referred to as "load port LP"). The controller CT controls each element of the substrate processing system PS to perform predetermined processing on a substrate W.

The substrate processing module PM performs different types of processing such as etching processing, trimming processing, film-forming processing, annealing processing, doping processing, lithography processing, cleaning processing, and ashing processing on a substrate W within the module. Some of the substrate processing modules PM may be a measurement module, which may measure the thickness of films formed on a substrate W or the dimensions of patterns formed on a substrate W, for example. The substrate processing apparatus 1 illustrated in FIG. 1 is an example of the substrate processing module PM.

The transfer module TM has a conveyer that transfers a substrate W, and transfers a substrate W between the substrate processing modules PM or between one of the substrate processing module PM and one of the load lock module LLM. The substrate processing modules PM and the load lock modules LLM are disposed adjacent to the transfer module TM. The transfer module TM are spatially isolated from or connected with the substrate processing modules PM or the load lock modules LLM by openable/closable gate valves.

The load-lock modules LLM1 and LLM2 are provided between the transfer module TM and the loader module LM. The load-lock modules LLM can change its internal pressure between atmospheric pressure and vacuum. The load-lock modules LLM transfer a substrate W from the loader module LM at atmospheric pressure to the transfer module TM in vacuum, or transfer a substrate W from the transfer module TM in vacuum to the loader module LM at atmospheric pressure.

The loader module LM has a conveyer that transfers a substrate W to transfer the substrate W between the load-lock module LLM and the load port LP. A front opening unified pod (FOUP) that can store 25 substrates W, for example, or an empty FOUP can be placed inside the load port LP. The loader module LM takes out a substrate W from the FOUP in the load port LP and transfers it to the load-lock module LLM. The loader module LM also takes out a substrate W from the load-lock module LLM and transfers it to the FOUP in the load port LP.

The controller CT controls each element of the substrate processing system PS to perform predetermined processing on a substrate W. The controller CT stores recipes, in which process procedures, process conditions, transfer conditions, etc. are set, and controls each element of the substrate processing system PS to perform predetermined processing on a substrate W in accordance with the recipes. The controller CT may also function as part or all of the controller 50 of the substrate processing apparatus 1 illustrated in FIG. 1.

<Example of the Present Processing Method>

Figure 3:
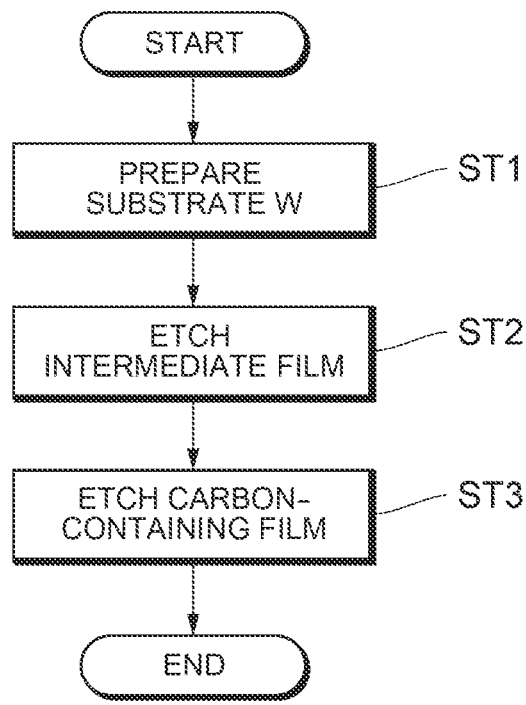
FIG. 3 is a flowchart illustrating the present processing method.

FIG. 3 is a flowchart showing the present processing method. As illustrated in FIG. 3, the present processing method includes: a step of preparing a substrate W (preparation step: step ST1); a step of etching an intermediate film (first etching step: step ST2); and etching a carbon-containing film (second etching step: step ST3).

Referring to FIGS. 4A to 4C, FIG. 5A, FIG. 5B, and FIG. 6, the following describes an example of the present processing method illustrated in FIG. 3. The following describes the process by way of an example where the controller 50 controls each element of the substrate processing apparatus 1 (see FIG. 1) to execute the present processing method.

Figure 4A:
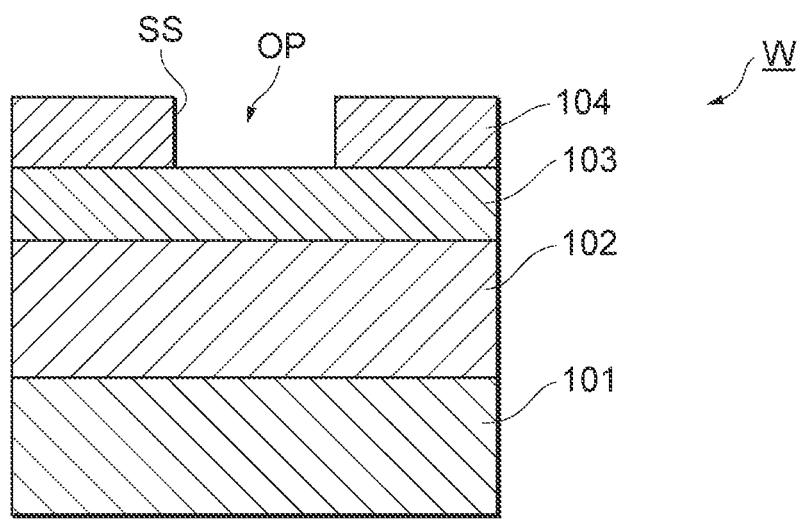
FIG. 4A illustrates an example of the cross-sectional structure of the substrate W after the process in step ST1.
Figure 4B:
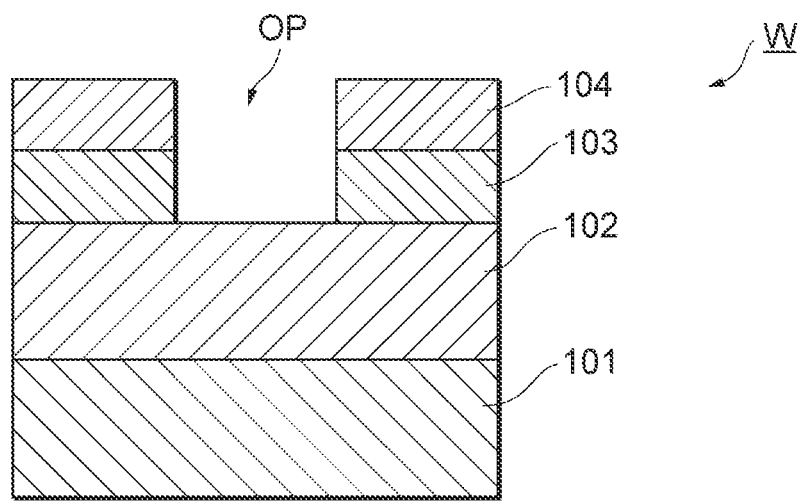
FIG. 4B illustrates an example of the cross-sectional structure of the substrate W after the process in step ST2.
Figure 4C:
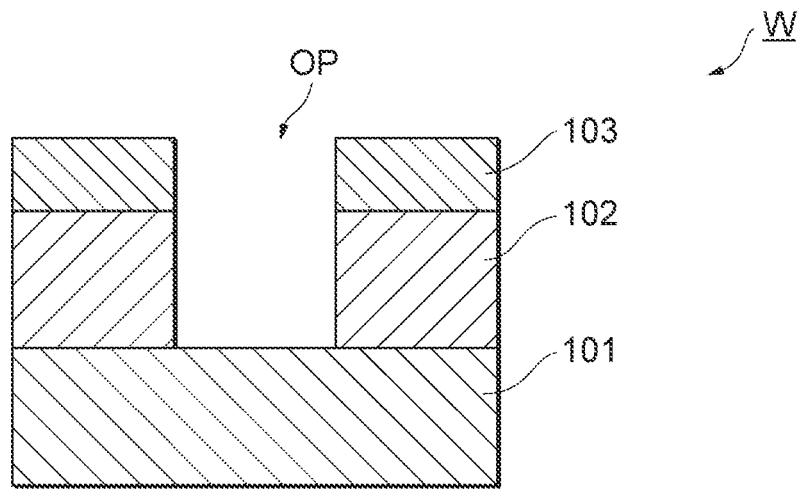
FIG. 4C illustrates an example of the cross-sectional structure of the substrate W after the process in step ST3.

FIG. 4A illustrates an example of the cross-sectional structure of the substrate W after the process in step ST1. FIG. 4B illustrates an example of the cross-sectional structure of the substrate W after the process in step ST2. FIG. 4C illustrates an example of the cross-sectional structure of the substrate W after the process in step ST3.

(Preparation of Substrate W: Step ST1)

In step ST1, a substrate W is prepared. The substrate W is disposed in the plasma processing space 10s (see FIG. 1). In the plasma processing space 10s, the substrate W is placed on the substrate support face 111a of the substrate support 11 and held by the electrostatic chuck. At least part of the process of forming each structure of the substrate W may be performed in the plasma processing space 10s. After all or part of the structures of the substrate W is formed in an apparatus or chamber outside the substrate processing apparatus 1, the substrate W may be disposed in the plasma processing space 10s.

For instance, the substrate W prepared in step ST1 is formed to include an underlying film 101, a carbon-containing film 102, an intermediate film 103, and a tin-containing film 104 that are stacked in this order (see FIG. 4A).

For instance, the underlying film 101 may be a silicon-containing film such as Si, SiC, SiON, SiN and/or $SiO_2$. The underlying film 101 may have etching characteristics different from those of the carbon-containing film 102, and may be formed from a material that is selectively etched against the carbon-containing film 102. The underlying film 101 may include a stack of films, for example, a stack of dielectric films such as a silicon oxide film and silicon nitride film on a silicon film.

The carbon-containing film 102 may be any film containing carbon, such as a spin-on carbon (SOC) film or amorphous carbon (amorphous carbon layer: ACL).

For instance, the intermediate film 103 is a spin-on-glass (SOG) film, a SiON film, a SiC film, or a Si-containing antireflection film (SiARC). The intermediate film 103 may include a stack of films, for example, a stack of a bottom anti-reflective coating (BARC) on a SiON film. The intermediate film 103 may have etching characteristics different from those of the carbon-containing film 102, and may be oxygen plasma resistant, for example.

For instance, the tin-containing film 104 includes tin oxide and/or tin hydroxide. The tin-containing film 104 may contain an organic material. For instance, the tin-containing film 104 may be a photoresist film.

Each film (underlying film 101, carbon-containing film 102, intermediate film 103, and/or tin-containing film 104) constituting the substrate W may be formed by methods such as CVD, ALD, and spin coating. Each of these films may be a flat film, or may be a film having unevenness.

The tin-containing film 104 has an opening pattern. The opening pattern defines at least one opening OP on the intermediate film 103 (see FIG. 4A). The opening OP is a space on the intermediate film 103 and is surrounded by sidewalls SS of the tin-containing film. As illustrated in FIG. 4A, the intermediate film 103 has an area covered by the tin-containing film 104 and an area exposed at the bottom of the opening OP.

The opening pattern of the tin-containing film 104 may have any shape in plan view of the substrate W (when the substrate W is viewed from top to bottom in FIG. 4A). For instance, the opening pattern may be a line-and-space (L/S) pattern in which a plurality of linear openings OP are arranged at regular intervals in plan view, or may be an array pattern in which a plurality of a hole-shaped openings OP such as a circle, ellipse, or rectangle are arranged in plan view.

For instance, the opening pattern of the tin-containing film 104 may be formed by lithography. Specifically, for instance, a photoresist film is formed on the intermediate film 103, and light (e.g., EUV excimer laser) is selectively applied for irradiation using an exposure mask. Then, the irradiated photoresist film is developed. This may form the opening pattern of the tin-containing film 104. For instance, the opening pattern may be a line-and-space (L/S) pattern. For instance, the opening pattern of the tin-containing film may be formed by etching.

(Etching of Intermediate Film: Step ST2)

In step ST2, the intermediate film 103 is etched. Specifically, for instance, processing gas is supplied from the gas supply 20 into the plasma processing space 10s, and an RF signal is supplied from the RF power supply 31 to the plasma processing space 10s (see FIG. 1). This forms a plasma in the plasma processing space 10s, and active species in the plasma are attracted to the substrate W. At this time, the tin-containing film 104 functions as a mask, and the intermediate film 103 is anisotropically etched from the exposed portion at the bottom of the opening OP (see FIG. 4A) in the depth direction of the opening OP (top to bottom direction in FIG. 4A). This transfers the opening pattern of the tin-containing film 104 to the intermediate film 103 (see FIG. 4B). During the etching of the intermediate film 103, a portion of the tin-containing film 104 may be etched.

When the intermediate film 103 is a silicon-containing film such as silicon oxide film, silicon nitride film, or silicon carbide film, the processing gas used in etching of the intermediate film 103 may be a fluorocarbon gas and/or a hydrofluorocarbon gas. For instance, fluorocarbon gases include $CF_4$, $C_4F_6$, and $C_4F_8$. For instance, hydrofluorocarbon gases include $CHF_3$, and $CH_3F$.

The tin-containing film 104 used as a mask may have a defect in the opening pattern. For instance, the defect can be scum or microbridges in the line-and-space (L/S) pattern. For instance, the defect can be generated when forming the opening pattern in the photoresist film by lithography.

Figure 5A:
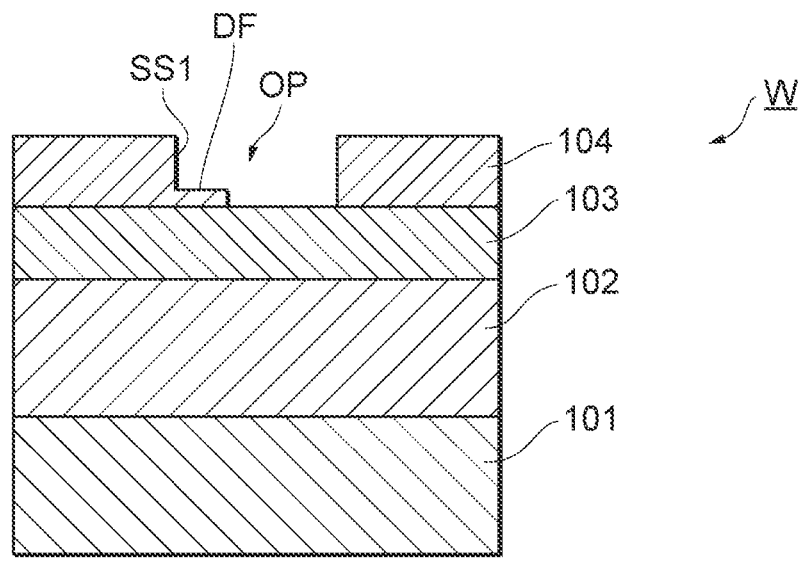
FIG. 5A illustrates an example of the cross-sectional structure of the substrate W before the process in step ST2.
Figure 5B:
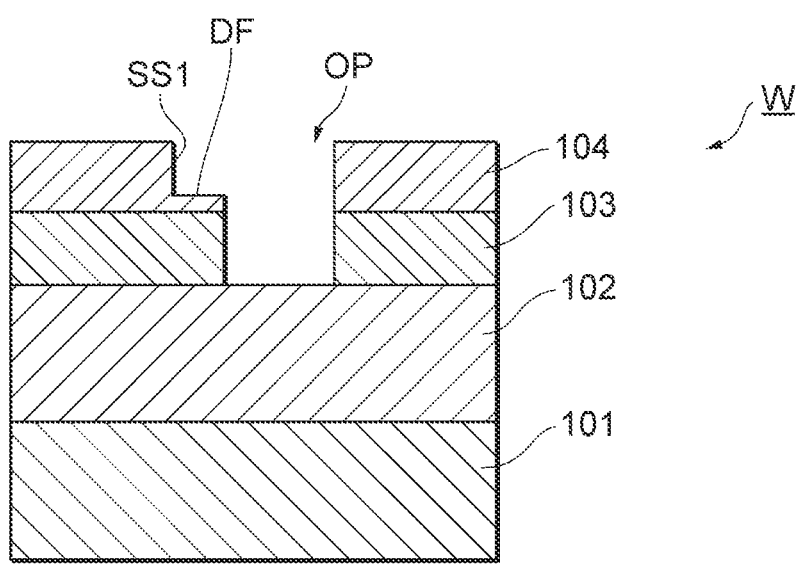
FIG. 5B illustrates an example of the cross-sectional structure of the substrate W after the process in step ST2.

FIG. 5A illustrates an example of the cross-sectional structure of the substrate W before the process in step ST2. FIG. 5B illustrates an example of the cross-sectional structure of the substrate W after the process in step ST2. FIGS. 5A and 5B illustrate an example of etching at a defective location when the opening pattern of the tin-containing film 104 has the defect.

As illustrated in FIG. 5A, a defect in the opening pattern of the tin-containing film 104 can be a residue DF extending from a part of the sidewall SS1 of the tin-containing film 104 to the central portion of the opening OP or to another part of the sidewall SS1 (e.g., a part facing the above part of the sidewall SS1 with the opening OP interposed therebetween). The residue DF may be formed between the part and the other part of the sidewall SS1. The exposed portion of the intermediate film 103 at the bottom of the opening OP is narrower than the defect-free portion (see FIG. 4A) by the residue DF.

The residue DF of the tin-containing film 104 functions as part of the mask in the etching of step ST2. As a result, as illustrated in FIG. 5B, the intermediate film 103 below the residue DF remains without being etched after the process in step ST2. That is, a defect in the opening pattern of the tin-containing film 104 can be transferred to the opening pattern that is formed in the intermediate film 103 by transferring in step ST2.

(Etching of Carbon-Containing Film 102: Step ST3)

In step ST3, the carbon-containing film 102 is etched (see FIG. 4C). Specifically, for instance, processing gas is supplied from the gas supply 20 into the plasma processing space 10s, and an RF signal is supplied from the RF power supply 31 to the plasma processing space 10s (see FIG. 1). This forms a plasma in the plasma processing space 10s, and active species in the plasma are attracted to the substrate W.

The processing gas contains hydrogen, halogen or carbon, and oxygen. For instance, the processing gas may include one or more gases including molecules containing H, Br and/or Cl, I (e.g., $H_2$, $Br_2$, $Cl_2$, HBr and/or HCl, HI, etc.). For instance, the processing gas may include one or more gases including molecules containing O (e.g., $O_2$, $CO_2$, and/or COS, etc.). For instance, the processing gas may include $CH_3OH$ gas or may include $CH_4$ gas and $O_2$ gas. For instance, the processing gas may also include inert gases such as He, Ar, and $N_2$.

As a result, the tin-containing film 104 is removed and the intermediate film 103 functions as a mask so that the carbon-containing film 102 is anisotropically etched from the exposed portion at the bottom of the opening OP (see FIG. 4B) in the depth direction of the opening OP. This forms an opening pattern corresponding to the opening pattern of the intermediate film 103 in the carbon-containing film 102 (see FIG. 4C). During the etching of the carbon-containing film 102, a portion of the intermediate film 103 may be etched.

The opening pattern of the intermediate film 103 may have a defect. For instance, if the opening pattern of the tin-containing film 104 has a defect as explained referring to FIGS. 5A and 5B, the defect can be transferred to the intermediate film 103 by etching in step ST2.

As illustrated in FIG. 5B, the defect (residue DF) of the opening pattern of the tin-containing film 104 is transferred to the opening pattern of the intermediate film 103. The exposed portion of the carbon-containing film 102 at the bottom of the opening OP is narrower than the defect-free portion (see FIG. 4B) by the residue DF.

Figure 6:
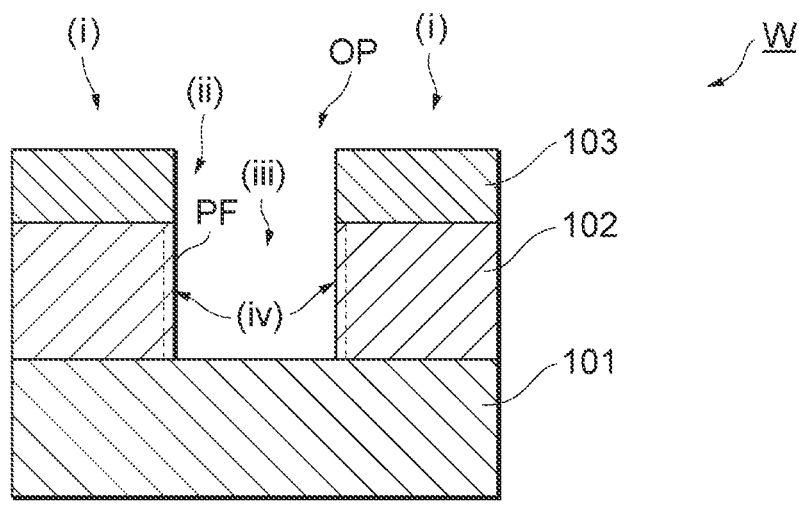
FIG. 6 illustrates an example of the cross-sectional structure of the substrate W after the process in step ST3.

FIG. 6 illustrates an example of the cross-sectional structure of the substrate W after the process in step ST3. FIG. 6 illustrates an example of etching at a defective location when the opening pattern of the intermediate film 103 has the defect.

In step ST3, a plasma is formed using processing gas containing hydrogen, halogen or carbon, and oxygen. This allows any two or more of the following processes to proceed at the same time. For instance, these processes include (i) removal of the tin-containing film 104 (including removal of tin scattered from the tin-containing film 104) by mainly hydrogen, halogen, and carbon in plasma, (ii) removal of a defect in the opening pattern of the intermediate film 103 by mainly hydrogen and halogen in plasma, (iii) anisotropic etching of the carbon-containing film by mainly oxygen in plasma, and (iv) formation of a protective film PF at the sidewall of the carbon-containing film 102 by the combination of mainly halogen or carbon with carbon in the carbon-containing film 102 in plasma.

For instance, in step ST3, the carbon-containing film 102 can be etched (the above (iii)) while removing a defect in the opening pattern of the intermediate film 103 that is used as a mask (the above (ii)). This suppresses the transfer of a defect in the intermediate film 103 to the opening pattern formed in the carbon-containing film 102 (see FIG. 6). Thus, the present processing method can make the dimensions and/or shape of the opening pattern formed in the carbon-containing film 102 uniform. For example, when the opening pattern is a line-and-space (L/S) pattern, this can suppress the increase in line edge roughness (LER) and line width roughness (LWR).

For instance, in step ST3, the carbon-containing film 102 can be etched (the above (iii)) while removing the tin-containing film 104 and tin scattered from the tin-containing film 104 (the above (i)). This can prevent tin scattered from the tin-containing film 104 from adhering to the substrate W. The substrate W after the processing of step ST3 does not have the tin-containing film 104 (see FIG. 6). Therefore, there is no need to separately provide a step of removing the tin-containing film 104, and the throughput can improve. As described later, the present processing method may have another step of removing the tin-containing film 104 before step ST3.

For instance, in step ST3, the carbon-containing film 102 can be etched (the above (iii)) while forming a protective film PF on the surface of the sidewall of the carbon-containing film 102 (the above (iv)). This allows the present processing method to control the dimensions and/or shape of the opening pattern formed in the carbon-containing film 102. For example, when the opening pattern is a line-and-space (L/S) pattern, this can control the line CD and space CD within a desired range.

When the underlying film 101 is the film to be etched, the present processing method may include a step of etching the underlying film 101 using the carbon-containing film 102 as a mask after the completion of step ST3. For instance, when the underlying film 101 is a film to be etched, such as silicon oxide film or silicon nitride film, the processing gas used in etching may be a fluorocarbon gas and/or a hydrofluorocarbon gas. This transfers the opening pattern of the carbon-containing film 102 to the underlying film 101. In this case, the carbon-containing film 102, together with the intermediate film 103 and tin-containing film 104, functions as one of the three-layered multilayer mask.

<Another Example of the Present Processing Method>

Figure 7:
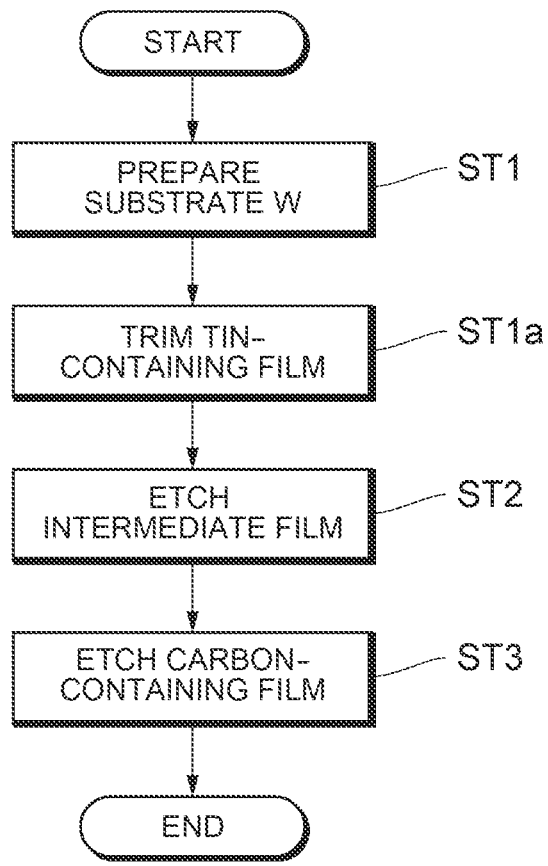
FIG. 7 is a flowchart showing another example 1 of the present processing method.

FIG. 7 is a flowchart showing another example 1 of the present processing method. The following describes example 1 of the present processing method, referring to FIGS. 3 through 6, FIG. 8A and FIG. 8B, and following the flowchart in FIG. 7. The example shown in FIG. 7 further includes a step of trimming the tin-containing film 104 (step ST1a) in addition to the example shown in FIG. 3. Step ST1a is executed between step ST1 and step ST2.

In step ST1a, at least the sidewalls of the tin-containing film 104 is trimmed. The trimming etches the sidewalls, and includes the process of changing the CD and removing the residue. For instance, trimming may be performed by etching the tin-containing film 104 using a plasma of a processing gas (trimming gas) containing at least one selected from the group consisting of hydrogen, halogen, and carbon. The trimming gas may be a hydrogen- or carbon-containing gas, such as $H_2$, HBr, HCl, HI, $CH_4$, $CHF_3$, or CO. The trimming gas may be a halogen-containing processing gas, for example, non-hydrogen-containing gases such as $Cl_2$ gas, and $Br_2$ gas. For trimming, a bias RF signal or a bias DC signal may be supplied to the substrate support 11 to generate a bias potential between the plasma and the substrate W. For trimming, a bias potential between the plasma and the substrate W may not be generated. In this case, the target temperature of the substrate W may be higher than in the case of generating the bias potential to promote volatilization of the reaction product (e.g., tin halide). The trimming may not use plasma. For instance, trimming may be performed by etching the tin-containing film 104 by chemical reaction with hydrogen halide gas. For instance, hydrogen halides may be HBr, HCl, HI, and the like. The trimming gas may further contain inert gas (Ar, $N_2$, etc.). Trimming at least the sidewalls of the tin-containing film 104 eliminates or reduces defects in the opening pattern of the tin-containing film 104. The following describes this point with reference to FIGS. 8A and 8B.

Figure 8A:
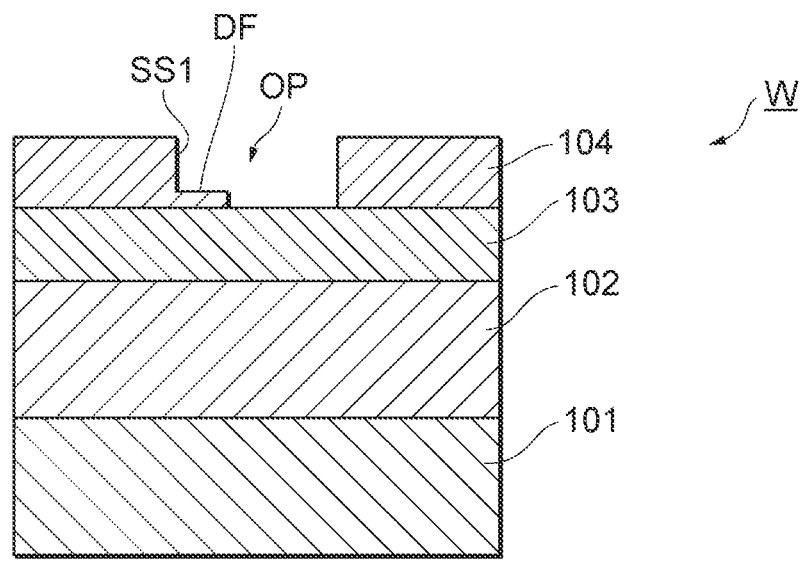
Figure 8B:
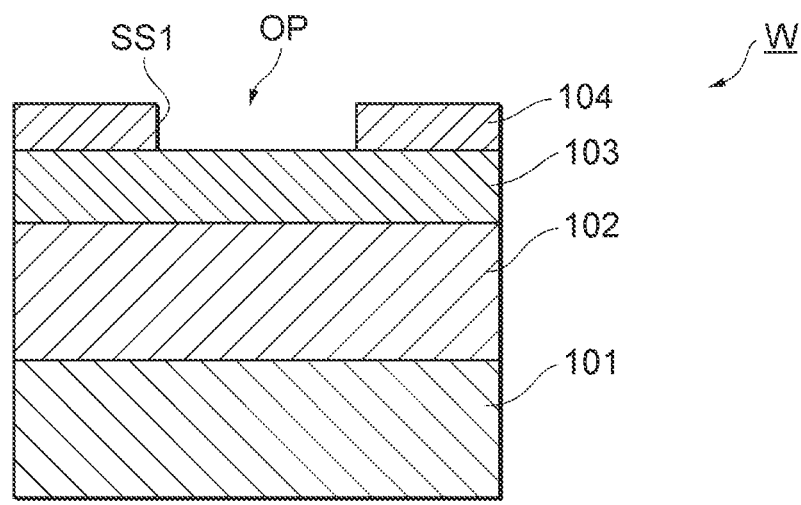

FIG. 8A illustrates an example of the cross-sectional structure of the substrate W before the process in step ST1a. FIG. 8B illustrates an example of the cross-sectional structure of the substrate W after the process in step ST1a. FIGS. 8A and 8B illustrate an example of trimming at a defective location when the opening pattern of the tin-containing film 104 has the defect.

As illustrated in FIG. 8A, a defect in the opening pattern of the tin-containing film 104 includes a residue DF extending from a part of the sidewall SS1 of the tin-containing film 104 to the central portion of the opening OP or to another part of the sidewall SS1. As illustrated in FIG. 8B, this residue DF can be removed by trimming the sidewalls (sidewall SS1 and sidewall SS2) of the tin-containing film 104 by step ST1a. Defects in the opening pattern of the tin-containing film 104 are removed or suppressed, whereby defects in the opening pattern transferred to the intermediate film 103 in step ST2 and defects in the opening pattern formed in the carbon-containing film 102 in step ST3 are also suppressed. Thus, this can make the dimensions and/or shape of the opening pattern of the carbon-containing film 102 more uniform.

The trimming in step ST1a changes the dimensions and/or shape of the opening pattern of the tin-containing film 104. For instance, as illustrated in FIG. 8B, the widthwise dimension of the opening OP after trimming is wider than before trimming. Therefore, the dimensions and/or shape of the opening pattern transferred to the intermediate film 103 by step ST2 also changes. Here, as described above, step ST3 in this processing method can control the dimensions and/or shape of the opening pattern formed in the carbon-containing film 102. In other words, this processing method can suppress the negative effects of trimming in step ST1a (e.g., when the opening pattern of the tin-containing film 104 is a line-and-space (L/S) pattern, a decrease in line width can cause pattern collapse in subsequent etching).

The trimming gas used in step ST1a may be included in the processing gas used for etching the intermediate film 103 in step ST2 so that the removal of defects in the opening pattern of the tin-containing film 104 and the etching of the intermediate film 103 proceed simultaneously. This prevents a defect in the tin-containing film 104 from being transferred to the opening pattern formed in the intermediate film 103.

Figure 9:
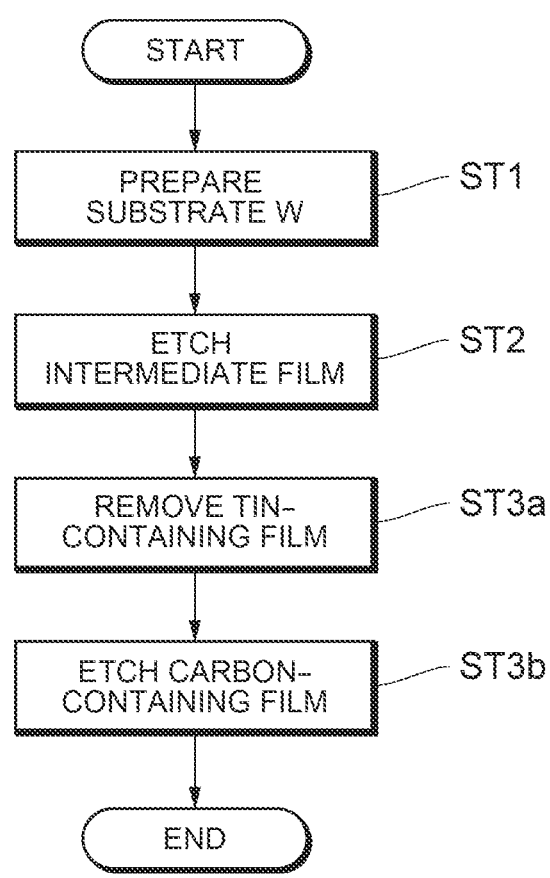
FIG. 9 is a flowchart showing another example 2 of the present processing method.

FIG. 9 is a flowchart showing another example 2 of the present processing method. The example shown in FIG. 9 differs from the example shown in FIG. 3 in that after step ST2, the tin-containing film 104 is removed (step ST3a) and then the carbon-containing film 102 is etched (step ST3b).

First, in step ST3a, the tin-containing film 104 is removed. For instance, the removal of the tin-containing film 104 may be performed by etching the tin-containing film 104 using a plasma of a processing gas containing at least one selected from the group consisting of hydrogen, halogen, and carbon. The tin-containing film 104 may be removed using hydrogen- or carbon-containing processing gases, such as $H_2$, HBr, HCl, HI gas, $CH_4$, $CHF_3$, and CO. The tin-containing film 104 may be removed using a halogen-containing processing gas, for example, hydrogen-free gas such as $Cl_2$ gas or $Br_2$ gas. To remove the tin-containing film 104, a bias RF signal or a bias DC signal may be supplied to the substrate support 11 to generate a bias potential between the plasma and the substrate W. To remove the tin-containing film 104, a bias potential between the plasma and the substrate W may not be generated. In this case, the target temperature of the substrate W may be higher than in the case of generating the bias potential to promote volatilization of the reaction product (e.g., tin halide). The tin-containing film 104 may be removed without using a plasma. For instance, the tin-containing film 104 may be removed by chemical reaction with hydrogen halide gas. For instance, hydrogen halides may be HBr, HCl, HI, and the like. The processing gas used for removal of the tin-containing film 104 may further contain inert gas (Ar, $N_2$, etc.).

Next, in step ST3b, the carbon-containing film 102 is etched. The etching of the carbon-containing film 102 may be performed using a plasma formed from the processing gases described in step ST3.

During removal of the tin-containing film 104 in step ST3a, defects in the opening pattern of the intermediate film 103 can also be removed or reduced. The carbon-containing film 102 is etched after removing the tin-containing film 104, which can suppress scattering of tin and adhesion of the tin to the substrate W during etching in step ST3b. This can suppress defects in the opening pattern formed in the carbon-containing film 102 in step ST3b.

The following describes examples of the present processing method. This disclosure is in no way limited by the following examples.

Example 1

A substrate W1 was prepared in a substrate processing apparatus 1 (step ST1). The substrate W1 included a stack of a SOC film, a SOG film, and a tin-containing film with an opening pattern on silicon in this order. The opening pattern in the tin-containing film was a line-and-space (L/S) pattern. Next, the SOG film of substrate W1 was etched (step ST2). Next, the SOC film was etched using $O_2$, HBr and He as processing gases (step ST3). Table 1 shows the values obtained by dividing the measured values of line CD, space CD, LWR, and LER after each step by the measured values of line CD, space CD, LWR, and LER in the initial state (step ST1).

TABLE 1

|  | Line CD | Space CD | LWR | LER |
| --- | --- | --- | --- | --- |
| After SOG etching | 1.08 | 0.93 | 1.12 | 1.12 |
| After SOC etching | 0.90 | 1.09 | 0.68 | 0.68 |

As shown in Table 1, the roughness (LWR and LER) of the opening pattern of the substrate W1 temporarily increased compared to the initial state by step ST2 (etching of the SOG film), but decreased compared to the initial state by step ST3 (etching of the SOC film). This is presumably because although defects in the tin-containing film are transferred to the SOG film in step ST2, the SOC film can be etched while removing the defects in the SOG film in step ST3. This processing method reduced the roughness of the opening pattern formed in the substrate W1 and enhanced the uniformity.

Example 2

A substrate W2 having the same configuration as that of Example 1 was prepared in the substrate processing apparatus 1 (step ST1). Next, the tin-containing film of the substrate W2 was trimmed using HBr and Ar as processing gases (step ST1a). Next, the SOG film was etched using $CF_4$ (step ST2). Next, the SOC film was etched using $O_2$, HBr and He as processing gases (step ST3). Here, the flow rate ratios of the processing gases $O_2$, HBr, and He were set in three patterns (hereinafter referred to as pattern 1, pattern 2, and pattern 3 in ascending order of the flow rate ratio of the HBr gas to the processing gas). Table 2 shows the values obtained by dividing the measured values of line CD, space CD, LWR, and LER after each step by the measured values of line CD, space CD, LWR, and LER in the initial state (step ST1).

TABLE 2

|  | Line CD | Space CD | LWR | LER |
| --- | --- | --- | --- | --- |
| After trimming | 0.81 | 1.17 | 0.76 | 0.88 |
| After SOG etching | 0.98 | 1.01 | 0.76 | 0.76 |
| After SOC etching (Pattern 1) | 0.90 | 1.09 | 0.65 | 0.64 |
| After SOC etching (Pattern 2) | 0.94 | 1.06 | 0.74 | 0.68 |
| After SOC etching (Pattern 3) | 1.08 | 0.92 | 0.79 | 0.76 |

As shown in Table 2, the roughness (LWR and LER) of the opening pattern of substrate W2 became smaller after each step of the present processing method, ST1a (trimming of tin-containing film), ST2 (etching of SOG film) and ST3 (etching of SOC film). This processing method reduced the roughness of the opening pattern formed in the substrate W2 and enhanced the uniformity.

As shown in Table 2, in step ST3 (etching of the SOC film), the size of line CD/space CD changed according to the composition ratio of the processing gas (flow rate ratio of $O_2$, HBr, and He). Presumably, this is because the amount of the protective film formed on the sidewall of the SOC film increased or decreased with a change in the content of halogen (Br) in the processing gas. This processing method controlled the line CD and space CD of the opening pattern formed on the substrate W2 within the desired range.

Reference Example

A substrate W3 having the same configuration as that of Example 1 was prepared in the substrate processing apparatus 1 (step ST1). Next, the tin-containing film of the substrate W3 was trimmed using HBr and Ar as processing gases (step ST1a). The SOG film was etched (step ST2). Next, the SOC film was etched using $N_2$ and $H_2$ and $O_2$ and COS as the processing gases, instead of the processing gases used in the present processing method. Pattern collapse was observed in any of the opening patterns after etching the SOC film.

One exemplary embodiment of the present disclosure provides techniques of appropriately etching a substrate including a tin-containing film.

The above embodiments are just for illustration, and various modifications can be made to the embodiments without departing from the scope and spirit of this disclosure. For instance, this processing method may be performed using another substrate processing apparatus including any plasma source, such as inductively coupled plasma or microwave plasma, other than the capacitively coupled substrate processing apparatus 1.

Embodiments of the present disclosure may include the following aspects.

Addendum 1

A substrate processing method including: providing a substrate, the substrate including a carbon-containing film, an intermediate film on the carbon-containing film, and a tin-containing film on the intermediate film, the tin-containing film having an opening pattern;
  performing first etching, the first etching including etching the intermediate film using the tin-containing film as a mask to transfer the opening pattern to the intermediate film; and
  performing second etching, the second etching using a plasma formed from a processing gas to remove the tin-containing film and etch the carbon-containing film using the intermediate film as a mask, the processing gas including hydrogen, halogen or carbon, and oxygen.

Addendum 2

The substrate processing method according to addendum 1, further including, before the first etching, trimming at least a sidewall of the tin-containing film using a plasma formed from a gas containing at least one selected from the group consisting of hydrogen, halogen, and carbon.

Addendum 3

The substrate processing method according to addendum 2, wherein the gas containing at least one selected from the group consisting of hydrogen, halogen and carbon is at least one gas selected from the group consisting of $H_2$ gas, HBr gas, HCl gas, HI gas, $CH_4$ gas, $CHF_3$ gas, $Cl_2$ gas, CO gas and $Br_2$ gas.

Addendum 4

The substrate processing method according to addendum 1, further including, before the first etching, trimming at least a sidewall of the tin-containing film using hydrogen halide.

Addendum 5

The substrate processing method according to addendum 4, wherein the hydrogen halide is at least one gas selected from the group consisting of HBr gas, HCl gas and HI gas.

Addendum 6

The substrate processing method according to any one of addenda 1 to 5, wherein the tin-containing film is a photoresist film formed on the intermediate film.

Addendum 7

The substrate processing method according to any one of addenda 1 to 6, wherein in the providing the substrate, the provided substrate includes a residue at a part of a sidewall of the tin-containing film, the residue extending to another part of the sidewall.

Addendum 8

The substrate processing method according to any one of addenda 1 to 7, wherein the processing gas includes a gas composed of molecules containing any one of Br, Cl, and I.

Addendum 9

The substrate processing method according to any one of addenda 1 to 7, wherein the processing gas includes $CH_3OH$ gas or a mixture of $CH_4$ gas and $O_2$ gas.

Addendum 10

The substrate processing method according to any one of addenda 1 to 9, wherein the processing gas includes inert gas.

Addendum 11

The substrate processing method according to any one of addenda 1 to 10, wherein the intermediate film is a spin-on-glass (SOG) film, a SiON film, a SiC film, or a Si-containing antireflection film (SiARC).

Addendum 12

The substrate processing method according to any one of addenda 1 to 11, wherein the carbon-containing film is a spin-on carbon (SOC) film or an amorphous carbon film (ACL).

Addendum 13

The substrate processing method according to any one of addenda 1 to 12, wherein the carbon-containing film is formed on an underlying film, and the method further includes, after the second etching, performing third etching that etches the underlying film using the carbon-containing film as a mask.

Addendum 14

A substrate processing method including: providing a substrate, the substrate including a carbon-containing film, an intermediate film on the carbon-containing film, and a tin-containing film on the intermediate film, the tin-containing film having an opening pattern;
  performing first etching, the first etching including etching the intermediate film using the tin-containing film as a mask to transfer the opening pattern to the intermediate film;
  removing the tin-containing film; and
  performing second etching, the second etching using a plasma formed from a processing gas to etch the carbon-containing film using the intermediate film as a mask, the processing gas including hydrogen, halogen or carbon, and oxygen.

Addendum 15

The substrate processing method according to addendum 14, wherein removing the tin-containing film includes etching the tin-containing film using a plasma formed from a gas containing at least one selected from the group consisting of hydrogen, halogen, and carbon.

Addendum 16

The substrate processing method according to addendum 15, wherein the gas containing at least one selected from the group consisting of hydrogen, halogen and carbon is at least one gas selected from the group consisting of $H_2$ gas, HBr gas, HCl gas, HI gas, $CH_4$ gas, $CHF_3$ gas, $Cl_2$ gas, CO gas and $Br_2$ gas.

Addendum 17

The substrate processing method according to addendum 14, wherein removing the tin-containing film includes removing the tin-containing film using hydrogen halide.

Addendum 18

The substrate processing method according to addendum 17, wherein the hydrogen halide is at least one gas selected from the group consisting of HBr gas, HCl gas and HI gas.

Addendum 19

A substrate processing apparatus comprising:
  a plasma processing chamber having at least one gas inlet and at least one gas outlet;
  a substrate support in the chamber;
  a plasma generator; and
  a controller configured to cause:
  placing a substrate on the substrate support, the substrate including a carbon-containing film, an intermediate film on the carbon-containing film, and a tin-containing film on the intermediate film, the tin-containing film having an opening pattern;
  etching the intermediate film using the tin-containing film as a mask to transfer the opening pattern to the intermediate film;
  performing first etching, the first etching including etching the intermediate film using the tin-containing film as a mask to transfer the opening pattern to the intermediate film; and performing second etching, the second etching using a plasma formed from a processing gas to remove the tin-containing film and etch the carbon-containing film using the intermediate film as a mask, the processing gas including hydrogen, halogen or carbon, and oxygen.

The above embodiments are just for illustration of the present disclosure, and are not intended to limit the present disclosure to them. Various modifications may be made to the embodiments as described above without departing from the scope and spirit of this disclosure. For instance, some elements in one embodiment can be added to another embodiment. Some elements in one embodiment can be replaced with corresponding elements in another embodiment.

What is claimed is:

1. A substrate processing method comprising:
  providing a substrate, the substrate including a carbon-containing film, an intermediate film on the carbon-containing film, and a tin-containing film on the intermediate film, the tin-containing film having an opening pattern;
  performing first etching, the first etching including etching the intermediate film using the tin-containing film as a mask to transfer the opening pattern to the intermediate film; and
  performing second etching, the second etching using a plasma formed from a processing gas to remove the tin-containing film and etch the carbon-containing film using the intermediate film as a mask, the processing gas including hydrogen, halogen or carbon, and oxygen.

2. The substrate processing method according to claim 1, further comprising, before the first etching, trimming at least a sidewall of the tin-containing film using a plasma formed from a gas containing at least one selected from the group consisting of hydrogen, halogen, and carbon.

3. The substrate processing method according to claim 2, wherein the gas containing at least one selected from the group consisting of hydrogen, halogen and carbon is at least one gas selected from the group consisting of $H_2$ gas, HBr gas, HCl gas, HI gas, $CH_4$ gas, $CHF_3$ gas, $Cl_2$ gas, CO gas and $Br_2$ gas.

4. The substrate processing method according to claim 1, further comprising, before the first etching, trimming at least a sidewall of the tin-containing film using hydrogen halide.

5. The substrate processing method according to claim 4, wherein the hydrogen halide is at least one gas selected from the group consisting of HBr gas, HCl gas and HI gas.

6. The substrate processing method according to claim 1, wherein the tin-containing film is a photoresist film formed on the intermediate film.

7. The substrate processing method according to claim 1, wherein in the providing the substrate, the provided substrate includes a residue at a part of a sidewall of the tin-containing film, the residue extending to another part of the sidewall.

8. The substrate processing method according to claim 1, wherein the processing gas includes a gas composed of molecules containing any one of Br, Cl, and I.

9. The substrate processing method according to claim 1, wherein the processing gas includes $CH_3OH$ gas or a mixture of $CH_4$ gas and $O_2$ gas.

10. The substrate processing method according to claim 1, wherein the processing gas includes inert gas.

11. The substrate processing method according to claim 1, wherein the intermediate film is a spin-on-glass (SOG) film, a SiON film, a SiC film, or a Si-containing antireflection film (SiARC).

12. The substrate processing method according to claim 1, wherein the carbon-containing film is a spin-on carbon (SOC) film or an amorphous carbon film (ACL).

13. The substrate processing method according to claim 1, wherein the carbon-containing film is formed on an underlying film, and the method further includes, after the second etching, performing third etching that etches the underlying film using the carbon-containing film as a mask.

14. A substrate processing method comprising:
  providing a substrate, the substrate including a carbon-containing film, an intermediate film on the carbon-containing film, and a tin-containing film on the intermediate film, the tin-containing film having an opening pattern;
  performing first etching, the first etching including etching the intermediate film using the tin-containing film as a mask to transfer the opening pattern to the intermediate film;
  removing the tin-containing film; and
  performing second etching, the second etching using a plasma formed from a processing gas to etch the carbon-containing film using the intermediate film as a mask, the processing gas including hydrogen, halogen or carbon, and oxygen.

15. The substrate processing method according to claim 14, wherein removing the tin-containing film includes etching the tin-containing film using a plasma formed from a gas containing at least one selected from the group consisting of hydrogen, halogen, and carbon.

16. The substrate processing method according to claim 15, wherein the gas containing at least one selected from the group consisting of hydrogen, halogen and carbon is at least one gas selected from the group consisting of $H_2$ gas, HBr gas, HCl gas, HI gas, $CH_4$ gas, $CHF_3$ gas, $Cl_2$ gas, CO gas and $Br_2$ gas.

17. The substrate processing method according to claim 14, wherein removing the tin-containing film includes removing the tin-containing film using hydrogen halide.

18. The substrate processing method according to claim 17, wherein the hydrogen halide is at least one gas selected from the group consisting of HBr gas, HCl gas and HI gas.

19. A substrate processing apparatus comprising:
- a plasma processing chamber having at least one gas inlet and at least one gas outlet;
- a substrate support in the chamber;
- a plasma generator; and
- a controller configured to cause:
- placing a substrate on the substrate support, the substrate including a carbon-containing film, an intermediate film on the carbon-containing film, and a tin-containing film on the intermediate film, the tin-containing film having an opening pattern;
- etching the intermediate film using the tin-containing film as a mask to transfer the opening pattern to the intermediate film;
- performing first etching, the first etching including etching the intermediate film using the tin-containing film as a mask to transfer the opening pattern to the intermediate film; and
- performing second etching, the second etching using a plasma formed from a processing gas to remove the tin-containing film and etch the carbon-containing film using the intermediate film as a mask, the processing gas including hydrogen, halogen or carbon, and oxygen.

* * * * *